US012722582B2

(12) United States Patent
Xu et al.

(10) Patent No.: US 12,722,582 B2
(45) Date of Patent: Sep. 1, 2026

(54) ADAPTABLE ELECTRONIC CONTROL UNIT INTERFACES

(71) Applicant: Cummins Inc., Columbus, IN (US)

(72) Inventors: Sheng Xu, Greenwood, IN (US); Mark D. Akins, Columbus, IN (US)

(73) Assignee: Cummins Inc., Columbus, IN (US)

( * ) Notice: Subject to any disclaimer, the term of this patent is extended or adjusted under 35 U.S.C. 154(b) by 510 days.

(21) Appl. No.: 18/495,497

(22) Filed: Oct. 26, 2023

(65) Prior Publication Data

US 2025/0142711 A1 May 1, 2025

(51) Int. Cl.
*B60R 16/02* (2006.01)
*H05K 1/02* (2006.01)

(52) U.S. Cl.
CPC .......... *B60R 16/02* (2013.01); *H05K 1/0213* (2013.01); *H05K 2201/1006* (2013.01)

(58) Field of Classification Search
CPC ................. B60R 16/02; H05K 1/0213; H05K 2201/1006
See application file for complete search history.

(56) References Cited

U.S. PATENT DOCUMENTS 5,544,000 A 8/1996 Suzuki et al.
6,897,688 B2 5/2005 Lee
6,981,090 B1 12/2005 Kutz et al.
11,831,719 B2 * 11/2023 Menz ...................... H02H 9/04
2005/0204224 A1 9/2005 Piasecki et al.
2005/0261821 A1 11/2005 Abe et al.
2007/0067090 A1 3/2007 Hashimoto et al.
2008/0074209 A1 3/2008 Ceylan et al.
2012/0137030 A1 5/2012 Gillingham
2012/0206889 A1 8/2012 Norman
2015/0378954 A1 12/2015 Field et al.
2017/0240124 A1 * 8/2017 Pradelles ....... H03K 19/017581
2019/0199451 A1 6/2019 Krall et al.
2020/0145017 A1 5/2020 Pardoen et al.
2020/0412338 A1 * 12/2020 Villalon ................. F02D 41/28

(Continued)

FOREIGN PATENT DOCUMENTS

DE 102015211706 12/2016

OTHER PUBLICATIONS

German Office Action, German Appln. No. 10 2024 131 087.1, (With English Translation) 14 pgs., dated Jun. 26, 2025.

(Continued)

*Primary Examiner* — Patrick O Neill
(74) *Attorney, Agent, or Firm* — Taft, Stettinius & Hollister LLP

(57) ABSTRACT

An electronic control includes a housing and an interface extending across the housing. A circuit board disposed in the housing includes a frequency input pin operatively coupled with the interface and an analog input pin operatively coupled the interface. A first conductive trace is operatively coupled with the frequency input pin. A second conductive trace operatively coupled with the analog input pin. A microcontroller is mounted on the circuit board and includes a selectably configurable input operatively coupled at least one of the first conductive trace and the second conductive trace. The microcontroller is configured to process at least one of a frequency signal received via the frequency input pin and an analog signal received at the analog input pin.

21 Claims, 4 Drawing Sheets

(56) References Cited

U.S. PATENT DOCUMENTS

2022/0107345 A1 4/2022 Nakagawa et al.
2023/0175454 A1 6/2023 Hershorin et al.
2024/0053175 A1* 2/2024 Rutkowski ............. G01D 18/00

OTHER PUBLICATIONS

Kramolis,, Josef, et al., "Sent/SPC Driver for the MPC55109 Microcentroller Family", Kramolis, Josef et al., "Sent/SPC Driver for the MPC5510 Microcontroller Family", Freescale Semiconductor Application Notes, Oct. 2010, 27 pgs.
Olea, Luis, "Using the SENT Transmitter Module in S12ZVC Devices", Olea, Luis, "Using the SENT Transmitter Module in S12ZVC Devices", Freescale Semiconductor, Dec. 2013, 9 pgs.

* cited by examiner

ADAPTABLE ELECTRONIC CONTROL UNIT INTERFACES

TECHNICAL FIELD

The present application relates to adaptable and configurable interfaces for an electronic control unit (ECU) and related apparatuses, systems, and processes.

BACKGROUND

An electronic control unit (ECU) may be provided in applications such as vehicle systems, engine systems, power generation systems, and other industrial equipment or systems. ECU designs face of number of constraints and limitations including those respecting configurability, adaptability, and flexibility to support multiple applications and features, and limitations on input/output (I/O) pins, mechanical package size, PCB density, and other constraints and limitations. There remains a significant need for the unique apparatuses, processes, and systems of the present disclosure.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some embodiments include apparatuses including a configurable ECU interface. Some embodiments include unique processes involving a configurable ECU interface. Some embodiments include unique systems including a configurable ECU interface. Further embodiments, forms, objects, features, advantages, aspects, and benefits shall become apparent from the following description and drawings.

DETAILED DESCRIPTION OF EXAMPLE EMBODIMENTS

Figure 1:
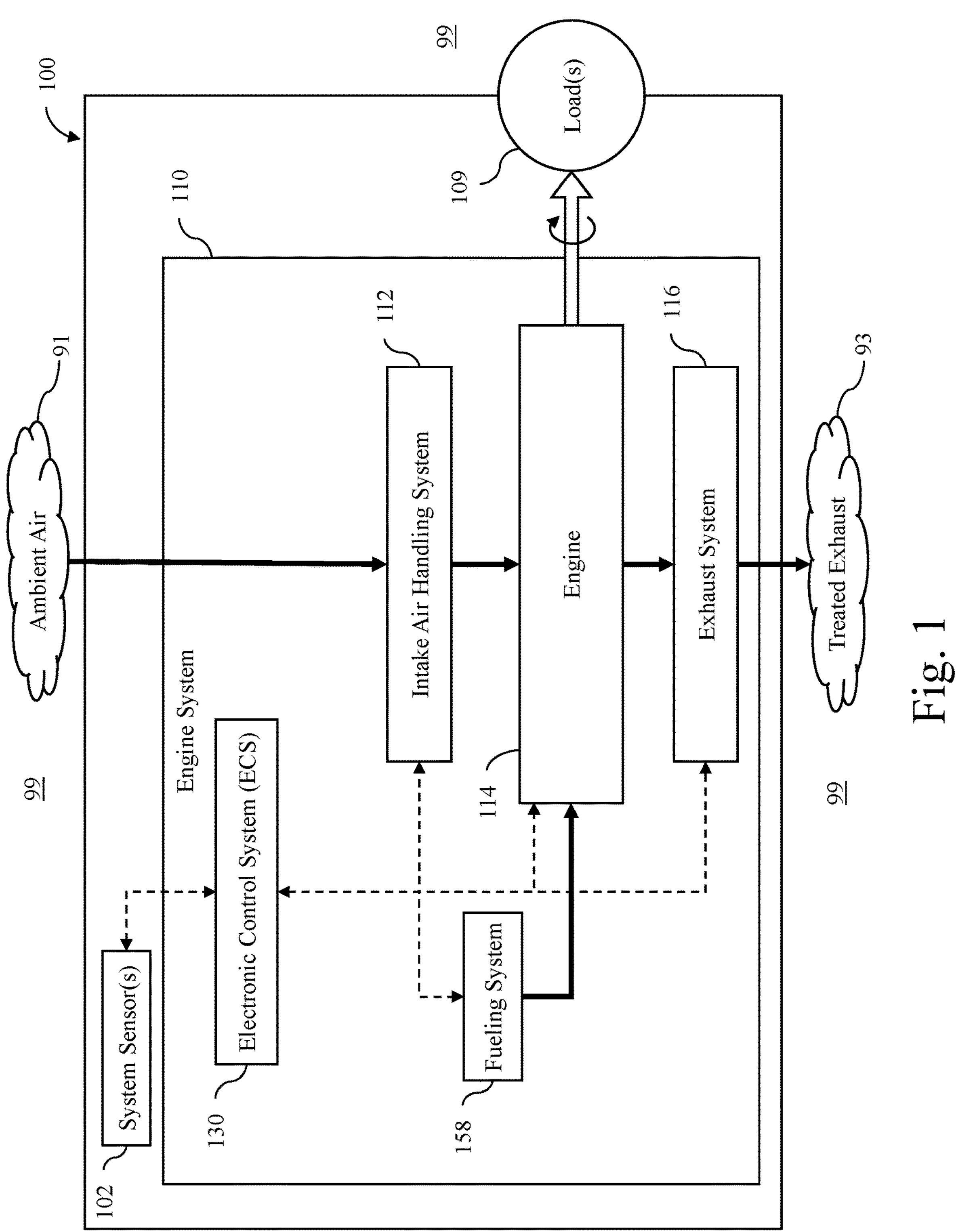
FIG. 1 is a schematic diagram depicting certain aspects of an example prime mover system in an example operating environment.

With reference to FIG. 1, there is illustrated an example system 100 including a prime mover system 110 (also referred to herein as system 110) and at least a portion of one or more loads 109. System 100 may be provide in a number of forms including, for example, in the form of a vehicle or vehicle powertrain system (e.g., an on-highway vehicle or vehicle powertrain system or an off-highway vehicle or vehicle powertrain system), a work machine or work machine powertrain system, a genset or genset powertrain system, or a hydraulic fracturing rig or hydraulic fracturing rig powertrain system, to name several non-limiting examples. In shall be appreciated that system 100 may include a number of other components as will occur to one of skill in the art with the benefit and insight of the present disclosure.

In the illustrated example, system 110 is configured and provided as an internal combustion engine system including an intake air handling system 112, an engine 114, an exhaust system 116, a fueling system 158, and an electronic control system 130. It shall be appreciated that system 110 may include a number of other components as will occur to one of skill in the art with the benefit and insight of the present disclosure. In other example embodiments, system 110 may be configured and provided as another type of prime mover system such as, for example, a hybrid combustion engine-electric prime mover system, a battery electric prime mover system, a fuel cell prime mover system, or another type of prime mover system.

Intake air handling system 112 may include one or more air handling conduits, air filters, compressors (such as a compressor of a turbocharger or supercharger), coolers (such as charger air coolers, intercoolers, and/or aftercoolers which may be, for example, of an air-to-air type or an air-to-liquid type), and sensors (such as temperature sensors, pressure sensors, mass flow sensors, and other types of sensors), as well as other components.

Engine 114 may be provided in a number of forms and typically includes a block including a plurality of cylinders and a head coupled with the block. The head typically includes intake ports, intake valves configured to selectively open and close the intake ports, exhaust ports, exhaust valves configured to selectively open and close the exhaust ports, injector bores, fuel injectors disposed in the injector bores, spark plug bores, and spark plugs disposed in the spark plug bores. A plurality of pistons may be provided in respective ones of the plurality of cylinders. A crankshaft may be coupled with the plurality of pistons and configured to translate reciprocating motion of the plurality of pistons to provide torque for driving one or more loads 109 which may include internal loads of system 110 (such oil pumps, valvetrains, fuel pumps and other loads of engine 114, and accessory loads of system 110). It shall be appreciated that system 110 may include a number of other components as will occur to one of skill in the art with the benefit and insight of the present disclosure.

Exhaust system 116 may include one or more exhaust handling conduits, turbines (such as a turbine of a turbocharger), aftertreatment components (such as oxidation catalysts, particular filters, selective catalytic reduction (SCR) catalysts, and/or other catalysts and aftertreatment components), and sensors (such as temperature sensors, pressure sensors, oxygen or lambda sensors, mass flow sensors, and other types of sensors), as well as other components.

Fueling system 158 may be configured and provided as a high-pressure common-rail fuel injection system including a plurality of fuel injectors in fluid communication with a common fuel rail, which supplies fuel at relatively high pressure to the plurality of fuel injectors. Fuel may be supplied to the common fuel rail by a high-pressure pump which, in turn, may be fed by a relatively low-pressure fuel circuit including a booster pump, which may be immersed in a tank containing a reservoir of fuel.

ECS 130 preferably includes one or more programmable microcontrollers of a solid-state, integrated circuit type, and one or more non-transitory memory media configured to store instructions executable by the one or more microcontrollers. For purposes of the present application the term microcontroller shall be understood to also encompass microprocessors and other types of integrated circuit processors. ECS 130 is in operative communication with and may be adapted and configured to control operation of and/or receive inputs from sensors or controllers of intake air handling system 112, engine 114, exhaust system 116, and fueling system 158. ECS 130 is in operative communication with and may be adapted and configured to control operation of and/or receive inputs from one or more system sensors 102 of system 100 which may include, for example, a throttle position sensor or an accelerator position sensor. It shall be appreciated that FIG. 1 depicts control relationships between the foregoing components conceptually using dashed arrows and that various communications hardware and protocols may be utilized to implement, such as one or more controller area networks (CAN) or other communications components.

ECS 130 can be implemented in any of a number of ways that combine or distribute the control function across one or more control units in various manners. The ECS 130 may execute operating logic that defines various control, management, and/or regulation functions. This operating logic may be in the form of dedicated hardware, such as a hardwired state machine, analog calculating machine, programming instructions, and/or a different form as would occur to those skilled in the art. The ECS 130 may be provided as a single component or a collection of operatively coupled components; and may be comprised of digital circuitry, analog circuitry, or a hybrid combination of both of these types. When of a multi-component form, the ECS 130 may have one or more components remotely located relative to the others in a distributed arrangement. The ECS 130 can include multiple processing units arranged to operate independently, in a pipeline processing arrangement, in a parallel processing arrangement, or the like. It shall be further appreciated that the ECS 130 and/or any of its constituent components may include one or more signal conditioners, modulators, demodulators, Arithmetic Logic Units (ALUs), Central Processing Units (CPUs), limiters, oscillators, control clocks, amplifiers, signal conditioners, filters, format converters, communication ports, clamps, delay devices, memory devices, Analog to Digital (A/D) converters, Digital to Analog (D/A) converters, and/or different circuitry or components as would occur to those skilled in the art to perform the desired communications.

An operating environment 99 is also depicted in FIG. 1. As described above, during typical operation of system 100, ambient air 91 of operating environment 99 is received as an input to system 100, and treated exhaust 93 from system 100 is released to operating environment 99. In some embodiments, one or more loads 109 may at least in part comprise a portion of operating environment 99. For example, in embodiments where system 100 is provided in the form of a genset or genset powertrain system, the one or more loads 109 may comprise loads at various nodes in a distributed power network in addition to load components which, even if small, are integral to system 100. As another example, in embodiments where system 100 is provided in the form of a vehicle or vehicle powertrain system, one or more loads 109 may include forces such as wind, gravity, road surface friction and other environmental load components in addition to load components which, even if small, are integral to system 100.

Figure 2:
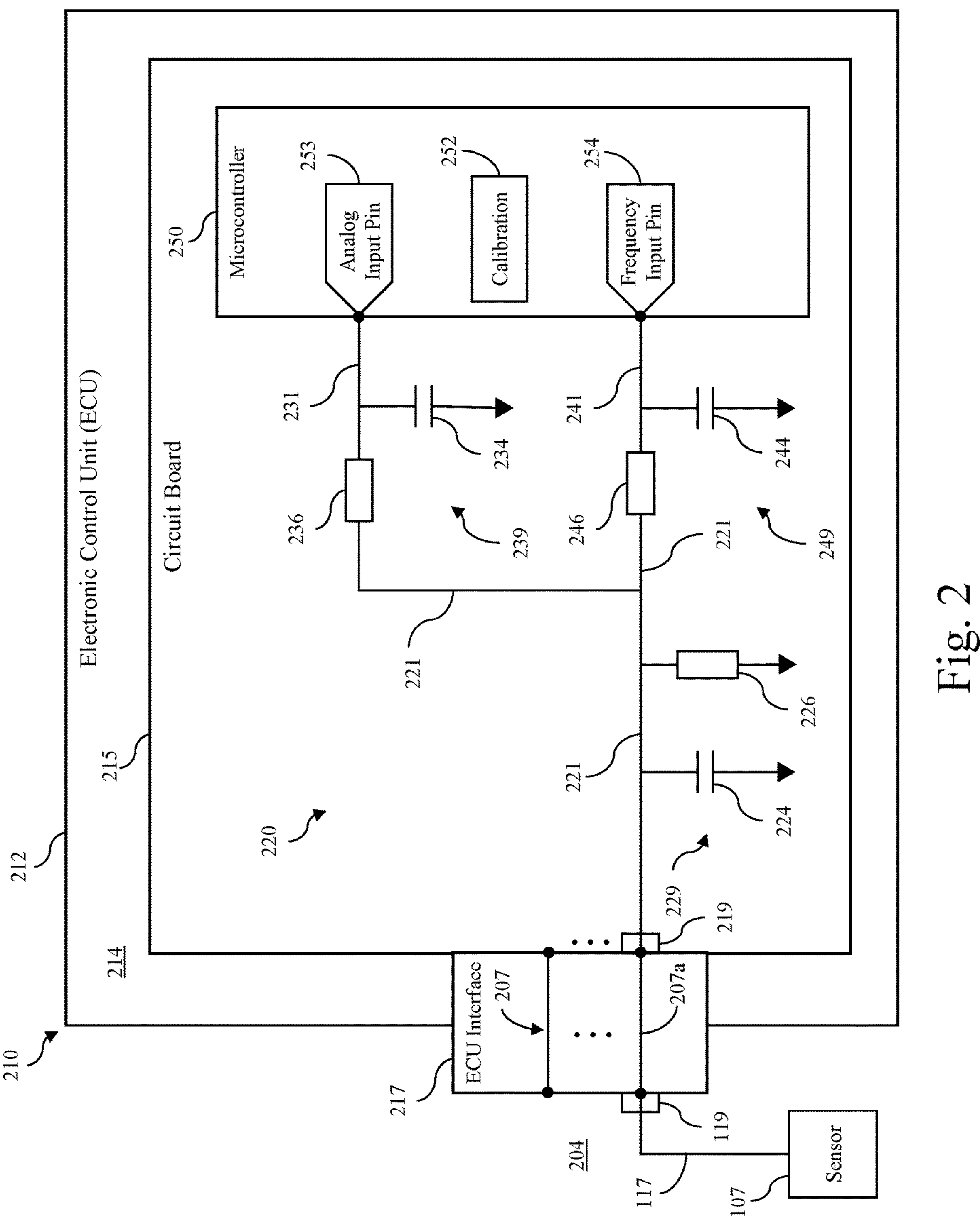
FIG. 2 is a schematic diagram depicting certain aspects of an example electronic control system.

With reference to FIG. 2 there is illustrated an example implementation of ECS 130. In the illustrated example, ECS 130 comprises an electronic control unit (ECU) 210. The ECU 210 comprises a housing 212 and an ECU interface 217 (also referred to herein as interface 217). The housing 212 surrounds and encloses an ECU interior 214 containing a plurality of electronic control components. The interface 217 extends across the housing 212 and includes a plurality of interface pins 207 conductively accessible at an exterior 204 of the housing 212 and conductively accessible at an interior 214 of the housing 212.

A circuit board 215 is contained by the housing 212. The circuit board 215 is operatively coupled with input signal conditioning circuit 220 and microcontroller 250 and may also be operatively coupled with other input and output signal circuits and other integrated circuits and discrete components. Input signal conditioning circuit 220 may comprise a plurality of conductive traces which may be integrally formed with circuit board 215 (for example, using deposition, etching, lamination, machining, masking, photoresist, and/or other formation techniques) and operatively coupled with circuit board 215 by such integral formation. Input signal conditioning circuit 220 may also comprise a plurality of discrete circuit components which may be mounted on or attached to the circuit board (for example, by surface mounting, through-hole mounting, or other attachment techniques) and thereby operatively coupled with circuit board 215. Microcontroller 250 may be mounted on or attached to circuit board 215 (for example, by surface mounting, through-hole mounting, or other attachment techniques) and thereby operatively coupled with circuit board 215.

Input signal conditioning circuit 220 is operatively coupled with one interface pin 207*a* of the plurality of interface pins 207 of ECU interface 217 and is also operatively coupled with analog input pin 253 of microcontroller 250 and frequency input pin 254 of microcontroller 250. Interface pin 207*a* may be selectably operatively coupled with a sensor 107 by connector 119 of a harness 117 and the same are depicted in an operatively coupled state in FIG. 1, it being appreciated that harness 117 may be also be decoupled from interface pin 207*a*.

Input signal conditioning circuit 220 of circuit board 215 comprises a conductive trace 221 which is operatively coupled with the interface pin 207*a* via a circuit board input terminal 219 and operatively coupled with a ground by a first resistive capacitive (RC) network 229 comprising capacitor 224 and resistor 226. Capacitor 224 is operatively coupled with conductive trace 221 and with ground and is configured to provide electrostatic discharge (ESD) protection for input signal conditioning circuit 220. It shall be appreciated that the configuration of a capacitor such as capacitor 224 and the other capacitors disclosed herein refers to its capacitance value and may also refer to other electrical characteristics, such as voltage rating or current rating as well as physical characteristics such as temperature ratings and dimensions, among other characteristics.

Resistor 226 is operatively coupled with conductive trace 221 and with ground and is configured in a pull-down configuration to provide a default reference voltage for input signal conditioning circuit 220. In other embodiments, resistor 226 may be operatively coupled with conductive trace 221 and a voltage source and may be configured in a pull-up configuration to provide a default reference voltage for input signal conditioning circuit 220. It shall be appreciated that the configuration of a resistor such as resistor 226 and the other resistors disclosed herein refers to its resistance value and may also refer to other electrical characteristics, such as voltage rating or current rating, as well as physical characteristics such as temperature ratings and dimensions, among other characteristics.

Input signal conditioning circuit 220 comprises a conductive trace 241 operatively coupled with the conductive trace 221 by an RC network 249 and operatively coupled with frequency input pin 254 of microcontroller 250. RC network 249 comprises resistor 246 and capacitor 244. Resistor 246 is operatively coupled with conductive trace 221 and conductive trace 241. Capacitor 244 is operatively coupled with conductive trace 241 and with ground. Resistor 246 and capacitor 244 are configured to provide low-pass filtering of the input signal provided to frequency input pin 254. Resistor 246 is also configured to provide input current limiting to frequency input pin 254 of microcontroller 250.

Input signal conditioning circuit 220 comprises a conductive trace 231 operatively coupled with the conductive trace 221 by an RC network 239 and operatively coupled with analog input pin 253 of microcontroller 250. RC network 239 comprises resistor 236 and capacitor 234. Resistor 236 is operatively coupled with conductive trace 221 and conductive trace 231. Capacitor 234 is operatively coupled with conductive trace 231 and with ground. Conductive trace 23 is also operatively coupled with analog input pin 253 of microcontroller 250. Resistor 236 and capacitor 234 are configured to provide low-pass filtering of the input signal provided to analog input pin 253. Resistor 236 is also configured to provide input current limiting to analog input pin 253 of microcontroller 250.

Figure 4:
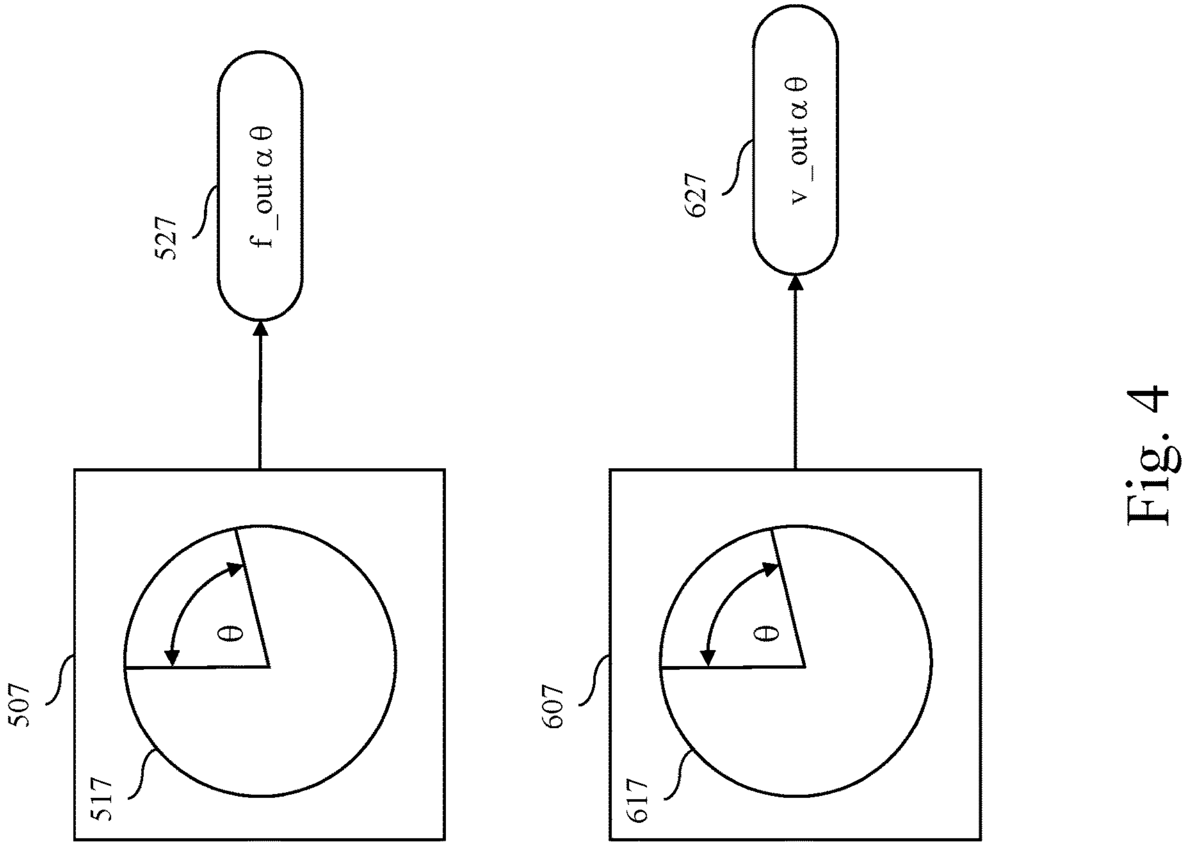
FIG. 4 is a schematic diagram depicting certain aspects of example sensors.

Sensor 107 may be configured and provided in the form of a frequency output sensor or an analog output sensor. In some embodiment, sensor 107 may comprise throttle position sensor or an accelerator pedal position sensor. As illustrated in FIG. 4, a frequency output sensor 507 may be configured to provide a frequency output 527 which is proportional to the position of a component 517 monitored by sensor 507. In the illustrated example, component 517 is configured and provided as an angularly adjustable component whose angular position (θ) is variable and frequency output is proportional to the angular position (θ). It shall be appreciated that other positional variables, as well as other non-positional sensed variables, may be sensed by sensor 507 in other embodiments.

As further illustrated in FIG. 4, an analog output sensor 607 may be configured to provide an analog output 627 which is proportional to the position of a component 617 monitored by sensor 607. In the illustrated example, component 617 is configured and provided as an angularly adjustable component whose angular position (θ) is variable and the analog output 627 (in the illustrated embodiment an analog voltage v) is proportional to the angular position (θ). It shall be appreciated that other positional variables, as well as other non-positional sensed variables, may be sensed by sensor 607 in other embodiments.

Microcontroller 250 may be configured to process at least one of a frequency signal received via the frequency input pin 254 and an analog signal received at the analog input pin 253. For example, a calibration 252 may be stored in a non-transitory memory of or associated with microcontroller 250 and may be configured to cause microcontroller 250 to process one of a frequency signal an analog signal.

Figure 3:
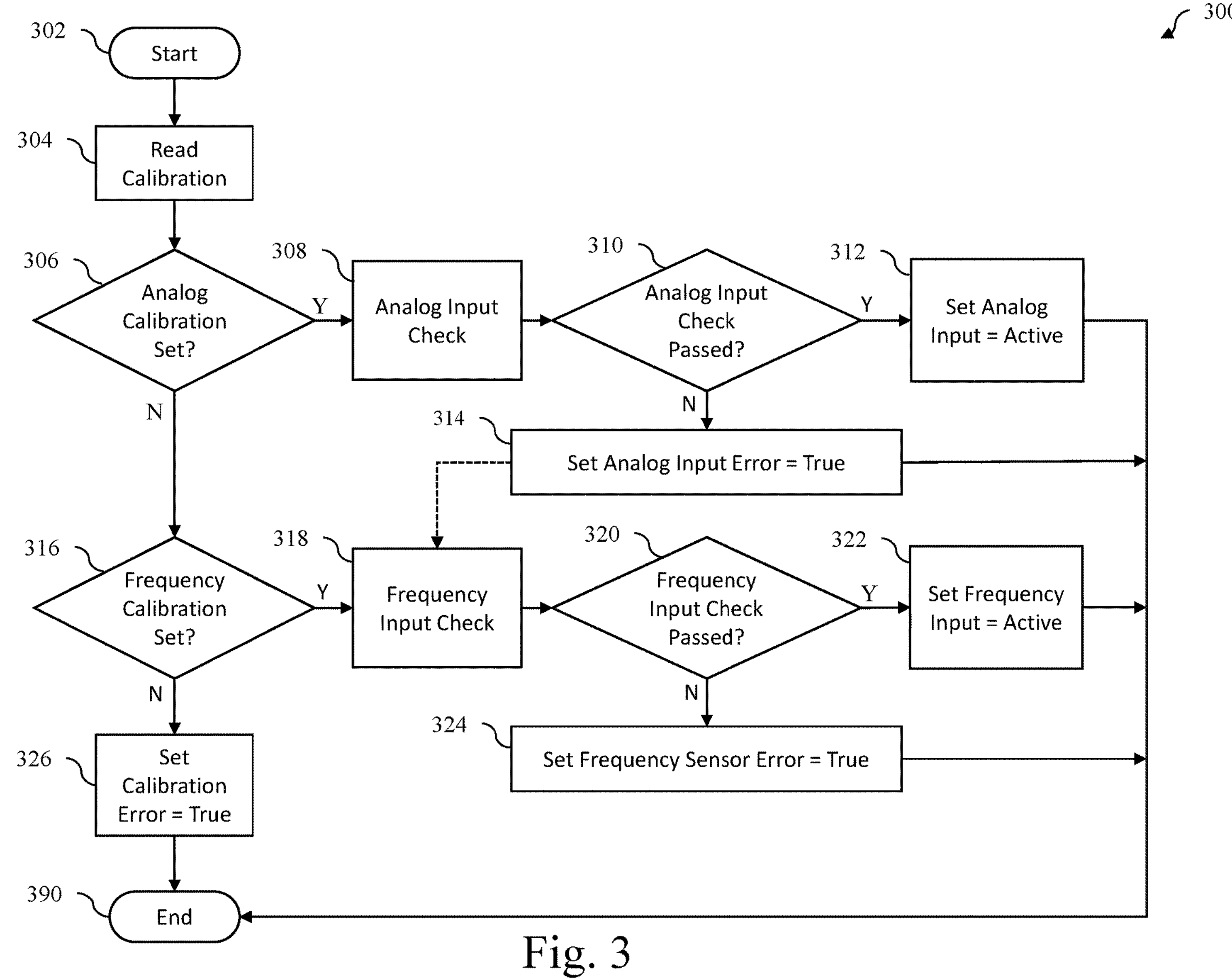
FIG. 3 is a flow diagram depicting certain aspects of an example system configuration process.

With reference to FIG. 3 there is illustrated an example system configuration process 300 (also referred to herein as process 300) which may be performed by or in connection with an electronic control system such as ECS 130 or another electronic control system, for example, by or in connection with microcontroller 250 or another microcontroller. Process 300 begins at start operation 302 and proceeds to operation 304 which reads one or more microcontroller calibrations, such as calibration 252 or another microcontroller calibration.

From operation 304, process 300 proceeds to conditional 306 which evaluates whether an analog calibration is set, for example, whether the calibration read at operation 304 is configured to cause the microcontroller to process and operate using an analog input such as an analog input received at analog input pin 253. If conditional 306 evaluates affirmative, process 300 proceeds to operation 308.

At operation 308, the microcontroller performs an analog input check. Operation 308 may, for example, include the microcontroller otherwise controlling a system such as system 100 such that, in the case of a correctly functioning system, analog input is received at an analog input pin such as analog input pin 253, and the microcontroller is operated to detect and process such an input. From operation 308, process 300 proceeds to conditional 310.

Conditional 310 evaluates whether the analog input check was-passed, for example, whether an analog input was received by the microcontroller and/or whether an expected value of an analog input was received by the microcontroller. If conditional 310 evaluates affirmative, process 300 proceeds to operation 312 which sets an analog input condition to active. From operation 312, process 300 proceeds to end operation 390 and may be subsequently repeated or recalled.

If conditional 310 evaluates negative, process 300 proceeds to operation 314 which sets an analog input error to true. From operation 312, process 300 proceeds to end operation 390 and may be subsequently repeated or recalled. In some embodiment, process 300 may alternatively optionally proceed from operation 314 to operation 318.

If conditional 306 evaluates negative, process 300 proceeds to conditional 316 which evaluates whether a frequency calibration is set, for example, whether the calibration read at operation 304 is configured to cause the microcontroller to process and operate using a frequency input received at frequency input pin 254. If conditional 316 evaluates negative, process 300 proceeds to operation 326 which sets a calibration error condition equal to true. From operation 326 process 300 proceeds to end operation 390 and may be subsequently repeated or recalled.

If conditional 316 evaluates affirmative, process 300 proceeds to operation 318. At operation 318, the microcontroller performs a frequency input check. Operation 318 may, for example, include the microcontroller otherwise controlling a system such as system 100 such that, in the case of a correctly functioning system, frequency input is received at an analog frequency pin such as frequency input pin 254, and the microcontroller is operated to detect and process such an input. From operation 318, process 300 proceeds to conditional 320.

Conditional 320 evaluates whether the frequency input check was-passed, for example, whether a frequency input was received by the microcontroller and/or whether an expected value of a frequency input was received by the microcontroller. If conditional 320 evaluates affirmative, process 300 proceeds to operation 322 which sets a frequency input condition to active. From operation 322, process 300 proceeds to end operation 390 and may be subsequently repeated or recalled.

If conditional 320 evaluates negative, process 300 proceeds to operation 324 which sets a frequency input error to true. From operation 322, process 300 proceeds to end operation 390 and may be subsequently repeated or recalled.

If conditional 306 evaluates negative, process 300 proceeds to conditional 316 which evaluates whether a frequency calibration is set, for example, whether the calibration read at operation 304 is configured to cause the microcontroller to process and operate using a frequency input received at frequency input pin 254. If conditional 316 evaluates negative, process 300 proceeds to operation 326 which sets a calibration error condition equal to true. From operation 326 process 300 proceeds to end operation 390 and may be subsequently repeated or recalled.

As illustrated by this detailed description, the present disclosure contemplates a plurality of embodiments including the following examples. A first example embodiment is an electronic control system comprising: an electronic control unit comprising a housing and an interface extending through the housing and including a plurality of interface pins accessible from an exterior of the housing and configured to conductively couple with one or more connectors; a circuit board disposed in the housing and comprising a plurality of conductive traces; a microcontroller mounted on the circuit board and including an analog input pin and a frequency input pin; and an input signal conditioning circuit comprising a first conductive trace of the circuit board operatively coupled with a first pin of the plurality of interface pins and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller; wherein the microcontroller is selectably configurable to process either a frequency signal received at the frequency input pin via the first pin of the plurality of interface pins and the input signal conditioning circuit and an analog signal received at the analog input pin via the first pin of the plurality of interface pins and the input signal conditioning circuit.

A second example embodiment includes the features of the first example embodiment, wherein the first RC network comprises a first capacitor configured to provide electrostatic discharge (ESD) protection.

A third example embodiment includes the features of the first example embodiment, wherein the first RC network comprises a first resistor configured to provide an input reference voltage detectable by the microcontroller.

A fourth example embodiment includes the features of the first example embodiment, wherein the second RC network comprises a low-pass filter comprising a second resistor operatively coupled with the first conductive trace and the second conductive trace and a second capacitor operatively coupled the second conductive trace and with ground.

A fifth example embodiment includes the features of the first example embodiment, wherein the third RC network comprises a low-pass filter comprising a third resistor operatively coupled with the first conductive trace and the third conductive trace and a third capacitor operatively coupled the second conductive trace and with ground.

A sixth example embodiment includes the features of the first example embodiment, wherein the microcontroller is selectably configurable to process either the frequency signal or the analog signal in response to a calibration stored in a non-transitory memory medium.

A seventh example embodiment includes the features of the sixth example embodiment, wherein the microcontroller is configured to automatically test for presence or absence of one of the frequency signal and the analog signal indicated by the calibration.

An eighth example embodiment is a process comprising: providing an electronic control unit including: a housing and an interface extending through the housing and including a plurality of interface pins accessible from an exterior of the housing and configured to conductively couple with one or more connectors, a circuit board disposed in the housing and including a plurality of conductive traces; a microcontroller mounted on the circuit board and including an analog input pin and a frequency input pin, and an input signal conditioning circuit comprising a first conductive trace of the circuit board operatively coupled with a first pin of the plurality of interface pins and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller; selectably configuring the microcontroller to process either a frequency signal received at the frequency input pin via the first pin of the plurality of interface pins and the input signal conditioning circuit and an analog signal received at the analog input pin via the first pin of the plurality of interface pins and the input signal conditioning circuit; and selectably processing with the microcontroller either the frequency signal or the analog signal.

A ninth example embodiment includes the features of the eighth example embodiment, comprising protecting the microcontroller form an electrostatic discharge (ESD) with a first capacitor of the first RC network.

A tenth example embodiment includes the features of the eighth example embodiment, comprising providing a reference voltage to the microcontroller with a first resistor of the first RC network.

An eleventh example embodiment includes the features of the eighth example embodiment, comprising low-pass filtering an input received at first interface pin with the second RC network and providing a resulting filtered input to the analog input pin of the microcontroller.

A twelfth example embodiment includes the features of the eighth example embodiment, comprising low-pass filtering an input received at first interface pin with the third RC network and providing a resulting filtered input to the frequency input pin of the microcontroller.

A thirteenth example embodiment includes the features of the eighth example embodiment, comprising processing with the microcontroller a calibration stored in a non-transitory memory medium effective to configuring the microcontroller to process either the frequency signal or the analog signal.

A fourteenth example embodiment includes the features of the thirteenth example embodiment, comprising operating the microcontroller to test for one of the frequency signal and the analog signal indicated by the calibration.

A fifteenth example embodiment is an apparatus comprising: a circuit board comprising a plurality of conductive traces; a microcontroller mounted on the circuit board and including an analog input pin and a frequency input pin; and an input signal conditioning circuit comprising a first conductive trace of the circuit board operatively coupled with an input terminal of the circuit board and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller; wherein the microcontroller is selectably configurable to process either a frequency signal and an analog signal.

A sixteenth example embodiment includes the features of the fifteenth example embodiment, wherein the first RC network comprises is configured to provide electrostatic discharge (ESD) protection.

A seventeenth example embodiment includes the features of the fifteenth example embodiment, wherein the first RC network is configured to provide an input reference voltage detectable by the microcontroller.

An eighteenth example embodiment includes the features of the fifteenth example embodiment, wherein the second RC network is configured to provide low-pass filtering of input received at the input terminal and provided to the analog input pin.

A nineteenth example embodiment includes the features of the fifteenth example embodiment, wherein the third RC network is configured to provide low-pass filtering of input received at the input terminal and provided to the frequency input pin.

A twentieth example embodiment includes the features of the fifteenth example embodiment, wherein the microcontroller is selectably configurable to process either the frequency signal or the analog signal in response to a calibration stored in a non-transitory memory medium.

A twenty-first example embodiment includes the features of the fifteenth example embodiment, comprising an electronic control unit comprising a housing and an interface extending through the housing and including a plurality of interface pins accessible from an exterior of the housing and configured to conductively couple with one or more connectors, the circuit board being contained in the housing, and one of the plurality of inputs pins operatively being coupled with a first pin of the plurality of interface pins.

It shall be appreciated that terms such as "a non-transitory memory," "a non-transitory memory medium," and "a non-transitory memory device" refer to a number of types of devices and storage mediums which may be configured to store information, such as data or instructions, readable or executable by a processor or other components of a computer system and that such terms include and encompass a single or unitary device or medium storing such information, multiple devices or media across or among which respective portions of such information are stored, and multiple devices or media across or among which multiple copies of such information are stored.

It shall be appreciated that terms such as "determine," "determined," "determining" and the like when utilized in connection with a control method or process, an electronic control system or controller, electronic controls, or components or operations of the foregoing refer inclusively to a number of acts, configurations, devices, operations, and techniques including, without limitation, calculation or computation of a parameter or value, obtaining a parameter or value from a lookup table or using a lookup operation, receiving parameters or values from a datalink or network communication, receiving an electronic signal (e.g., a voltage, frequency, current, or pulse-width modulation (PWM) signal) indicative of the parameter or value, receiving output of a sensor indicative of the parameter or value, receiving other outputs or inputs indicative of the parameter or value, reading the parameter or value from a memory location on a computer-readable medium, receiving the parameter or value as a run-time parameter, and/or by receiving a parameter or value by which the interpreted parameter can be calculated, and/or by referencing a default value that is interpreted to be the parameter value.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. An electronic control system comprising:

an electronic control unit comprising a housing and an interface extending through the housing and including a plurality of interface pins accessible from an exterior of the housing and configured to conductively couple with one or more connectors;

a circuit board disposed in the housing and comprising a plurality of conductive traces;

a microcontroller mounted on the circuit board and including an analog input pin and a frequency input pin; and an input signal conditioning circuit comprising a first conductive trace of the circuit board operatively coupled with a first pin of the plurality of interface pins and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller;

wherein the microcontroller is selectably configurable to process either a frequency signal received at the frequency input pin via the first pin of the plurality of interface pins and the input signal conditioning circuit and an analog signal received at the analog input pin via the first pin of the plurality of interface pins and the input signal conditioning circuit.

2. The electronic control system of claim 1, wherein the first RC network comprises a first capacitor configured to provide electrostatic discharge (ESD) protection.

3. The electronic control system of claim 1, wherein the first RC network comprises a first resistor configured to provide an input reference voltage detectable by the microcontroller.

4. The electronic control system of claim 1, wherein the second RC network comprises a low-pass filter comprising a second resistor operatively coupled with the first conductive trace and the second conductive trace and a second capacitor operatively coupled the second conductive trace and with ground.

5. The electronic control system of claim 1, wherein the third RC network comprises a low-pass filter comprising a third resistor operatively coupled with the first conductive trace and the third conductive trace and a third capacitor operatively coupled the second conductive trace and with ground.

6. The electronic control system of claim 1, wherein the microcontroller is selectably configurable to process either the frequency signal or the analog signal in response to a calibration stored in a non-transitory memory medium.

7. The electronic control system of claim 6, wherein the microcontroller is configured to automatically test for presence or absence of one of the frequency signal and the analog signal indicated by the calibration.

8. A process comprising:

providing an electronic control unit including:

a housing and an interface extending through the housing and including a plurality of interface pins accessible from an exterior of the housing and configured to conductively couple with one or more connectors, a circuit board disposed in the housing and including a plurality of conductive traces;

a microcontroller mounted on the circuit board and including an analog input pin and a frequency input pin, and an input signal conditioning circuit comprising a first conductive trace of the circuit board operatively coupled with a first pin of the plurality of interface pins and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller;

selectably configuring the microcontroller to process either a frequency signal received at the frequency input pin via the first pin of the plurality of interface pins and the input signal conditioning circuit and an analog signal received at the analog input pin via the first pin of the plurality of interface pins and the input signal conditioning circuit; and selectably processing with the microcontroller either the frequency signal or the analog signal.

9. The process of claim 8, comprising protecting the microcontroller form an electrostatic discharge (ESD) with a first capacitor of the first RC network.

10. The process of claim 8, comprising providing a reference voltage to the microcontroller with a first resistor of the first RC network.

11. The process of claim 8, comprising low-pass filtering an input received at first interface pin with the second RC network and providing a resulting filtered input to the analog input pin of the microcontroller.

12. The process of claim 8, comprising low-pass filtering an input received at first interface pin with the third RC network and providing a resulting filtered input to the frequency input pin of the microcontroller.

13. The process of claim 8, comprising processing with the microcontroller a calibration stored in a non-transitory memory medium effective to configuring the microcontroller to process either the frequency signal or the analog signal.

14. The process of claim 13, comprising operating the microcontroller to test for one of the frequency signal and the analog signal indicated by the calibration.

15. An apparatus comprising:

a circuit board comprising a plurality of conductive traces;

a microcontroller mounted on the circuit board and including an analog input pin and a frequency input pin; and an input signal conditioning circuit comprising a first conductive trace of the circuit board operatively coupled with an input terminal of the circuit board and operatively coupled with ground by a first resistive capacitive (RC) network, a second conductive trace operatively coupled with the first conductive trace by a second RC network and operatively coupled with the analog input pin of the microcontroller, and a third conductive trace operatively coupled with the first conductive trace by a third RC network and operatively coupled with the frequency input pin of the microcontroller;

wherein the microcontroller is selectably configurable to process either a frequency signal and an analog signal.

16. The apparatus of claim 15, wherein the first RC network comprises is configured to provide electrostatic discharge (ESD) protection.

17. The apparatus of claim 15, wherein the first RC network is configured to provide an input reference voltage detectable by the microcontroller.

18. The apparatus of claim 15, wherein the second RC network is configured to provide low-pass filtering of input received at the input terminal and provided to the analog input pin.

19. The apparatus of claim 15, wherein the third RC network is configured to provide low-pass filtering of input received at the input terminal and provided to the frequency input pin.

20. The apparatus of claim 15, wherein the microcontroller is selectably configurable to process either the frequency signal or the analog signal in response to a calibration stored in a non-transitory memory medium.

21. The apparatus of claim 15, comprising an electronic control unit comprising a housing and an interface extending through the housing and including a plurality of interface pins accessible from an exterior of the housing and configured to conductively couple with one or more connectors, the circuit board being contained in the housing, and one of the plurality of inputs pins operatively being coupled with a first pin of the plurality of interface pins.

* * * * *